(12) United States Patent
Brintzinger

(10) Patent No.: US 6,509,208 B1
(45) Date of Patent: Jan. 21, 2003

(54) METHOD FOR FORMING STRUCTURES ON A WAFER

(75) Inventor: Axel Brintzinger, Dresden (DE)

(73) Assignee: Infineon AG, Munich (DE)

( * ) Notice: Subject to any disclaimer, the term of this patent is extended or adjusted under 35 U.S.C. 154(b) by 0 days.

(21) Appl. No.: 09/952,839

(22) Filed: Sep. 14, 2001

(51) Int. Cl.⁷ .............................................. H01L 21/44
(52) U.S. Cl. ..................................................... 438/125
(58) Field of Search ........................... 438/125, 14, 15, 438/18

(56) References Cited

U.S. PATENT DOCUMENTS 5,468,995 A * 11/1995 Higgins, III ................ 257/697
5,961,217 A * 10/1999 Heshmat ..................... 384/105
6,245,595 B1 * 6/2001 Nguyen et al. ............. 438/108
6,313,528 B1 * 11/2001 Solberg ....................... 257/723

* cited by examiner

Primary Examiner—David Nelms
Assistant Examiner—Quoc Hoang
(74) Attorney, Agent, or Firm—Fish & Richardson, P.C.

(57) ABSTRACT

A method for fabricating a structure on an integrated circuit wafer, includes applying an anti-sticking coating to a surface of a mold, depositing a first material on the anti-sticking coating, and removing a portion of the first material to expose the anti-sticking coating. A first interface between the mold and the first material has a first adhesiveness. The process also includes placing the anti-sticking coating in contact with the wafer, and removing the mold from the wafer. A second interface between the first material and the wafer has a second adhesiveness that is greater than the first adhesiveness.

15 Claims, 5 Drawing Sheets

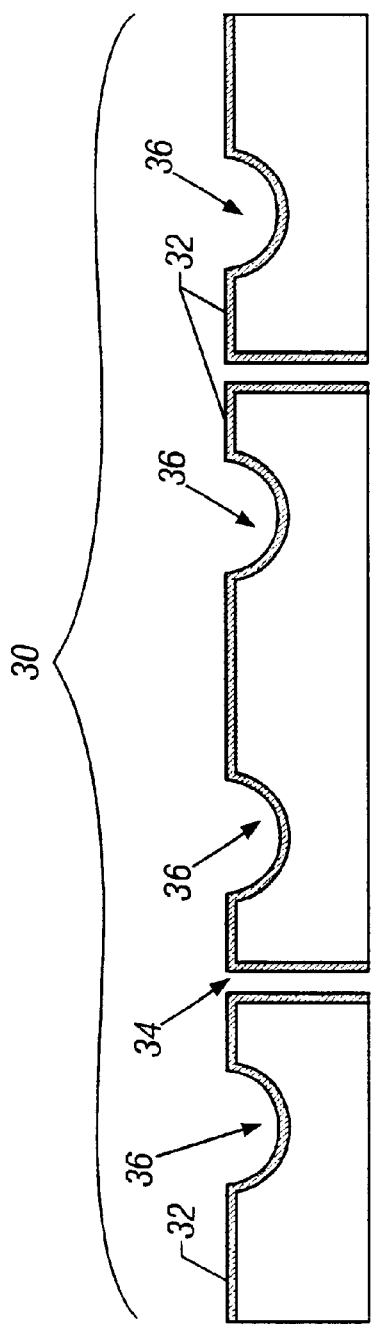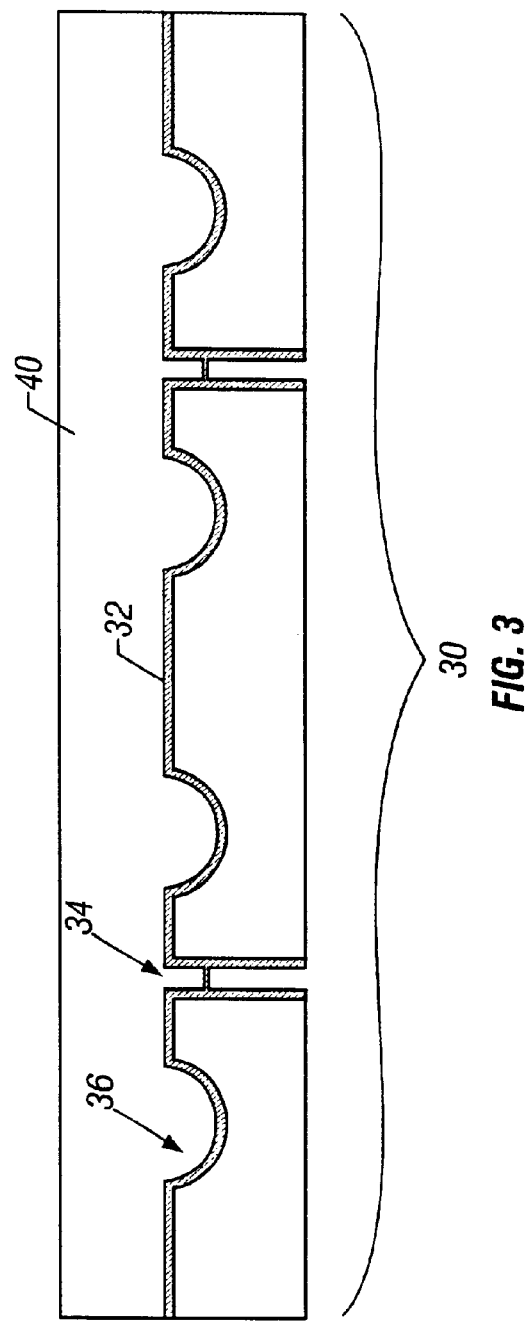

METHOD FOR FORMING STRUCTURES ON A WAFER

TECHNICAL FIELD

This invention relates to fabricating structures on wafers.

BACKGROUND

With wafer level packaging (WLP), semiconductor manufacturing processes test and burn-in integrated circuits (ICs) at a wafer level instead of testing and burning-in the ICs in individual packaged form. Such wafer level test (WLT) and wafer level burn-in (WLBI) require placing the wafers on test boards. Compliant structures are used to reduce thermal and mechanical stresses between the wafer and the test board and to assist in providing electrical interconnects so that the ICs can be tested while in wafer form. Since compliant structures are elastic, they can be moved in up to three-dimensions. In other words, in a raised temperature environment, compliant structures decouple the stress when a wafer and a test board expand at different rates due to the different coefficients of thermal expansion between the test board and the wafer.

Several methods of manufacturing compliant structures exist. One method includes forming compliant structures by wire bonding springs onto the surface of the wafer and plating the wire bond spring structures using an alloy. Another compliant structure manufacturing process includes laminating a polymer on the top of the wafer, embossing a negative shape of the springs into the polymer to form a mold, and then plating an alloy into the embossed mold.

SUMMARY

The invention is directed to a method for fabricating structures on an integrated circuit wafer. In particular, the invention relates to forming compliant elements on the surface of a wafer by forming the compliant element in a mold prior to placing the compliant element on the wafer. One practice of the invention includes applying an anti-sticking coating to a surface of a mold, depositing a first material on the anti-sticking coating, and removing a portion of the first material to expose the anti-sticking coating. The resulting first interface between the mold and the first material has a first adhesiveness.

The method also includes placing the anti-sticking coating in contact with the wafer, and removing the mold from the wafer. This forms a second interface between the material and the wafer that has a second adhesiveness greater than the first adhesiveness.

One aspect further includes applying a second material to the wafer and to the first material. This second material forms a rerouting layer. In addition, the first material is laminated onto the wafer. Further, laminating the first material to the wafer also includes spraying a solvent onto the surface of the substrate.

In other embodiments, the first material can also form a rerouting layer, a snap mechanism, a compression stop and/or a compliant structure. In other embodiments, the first material can be removed leaving the second material as the compliant structure.

This method can be performed at low temperatures, thereby preventing damage to the ICs on the wafer from mechanical stress. In addition, the method allows uniform deposition of a variety of materials (e.g., polymethyl methacrylate, silicone, polymers, and epoxies) on the wafer. Complicated three-dimensional shapes can also be created to connect the wafer to a test board (e.g., a snap mechanism).

DESCRIPTION OF THE DRAWINGS

FIG. 2 is a cross-sectional diagram showing a mold used for making a compliant structure.

FIG. 3 is a cross-sectional diagram showing a compliant material deposited onto the mold.

DETAILED DESCRIPTION

Figure 1:
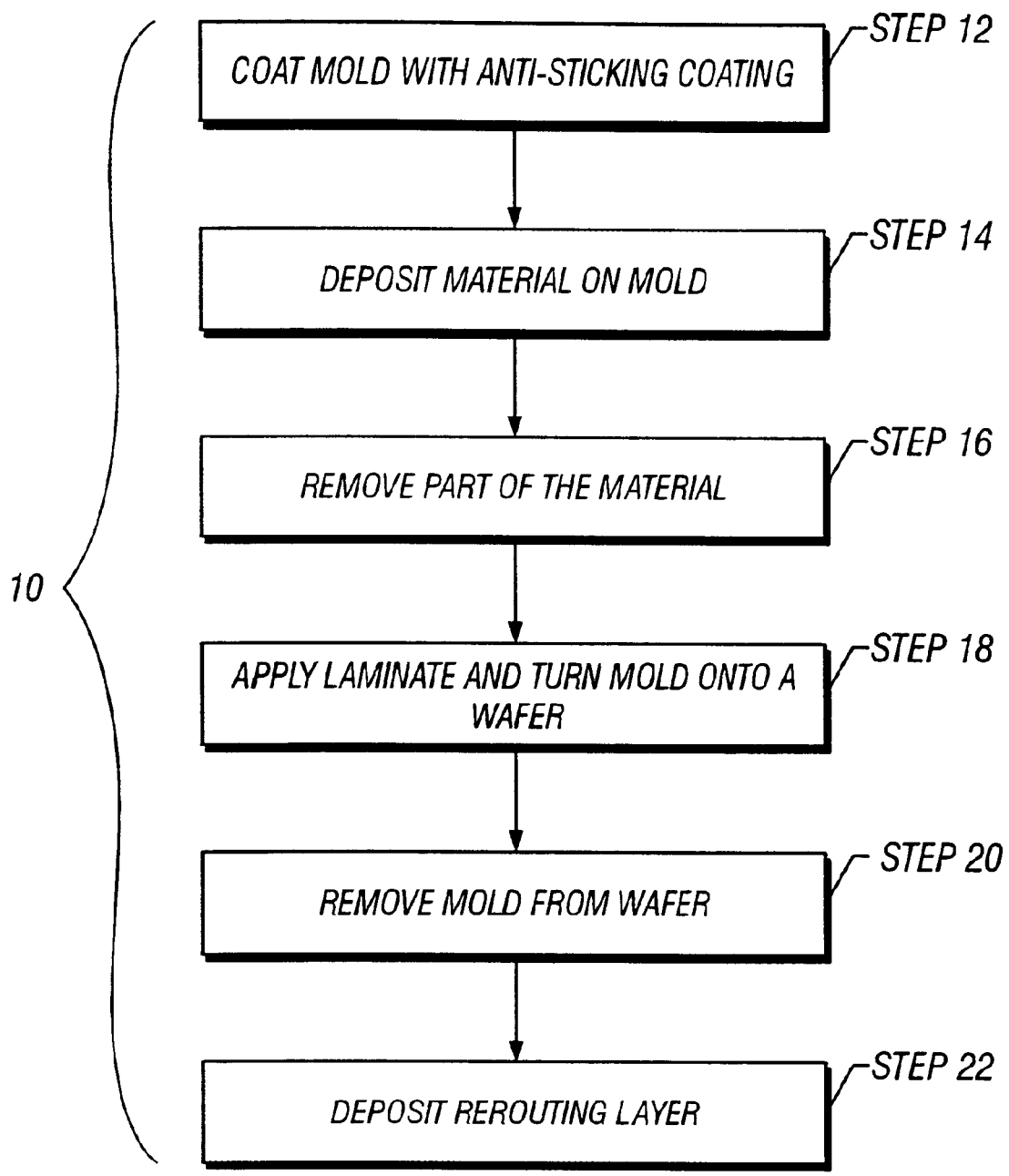
FIG. 1 is a flow chart of a process for forming a compliant structure.

Previous methods for fabricating compliant structures have included subjecting a wafer and ICs contained on the wafer to high temperatures. These high temperatures are required to manufacture the compliant structures onto the surface of the wafer. The heat applied to the compliant structures subjects the wafer to thermal stresses that can cause cracking or warping and damage to the ICs. Referring to FIG. 1, a process 10 for fabricating compliant structures is performed at low temperatures away from the wafer, thereby preventing the thermal stresses from damaging the wafer and the ICs on the wafer.

Referring to FIG. 2, an anti-sticking coating 32 (e.g., polytetrafluorethylene, sold under the trademark TEFLON®) is applied to a plastic mold 30 (step 12). Mold 30 has a series of indentations 36 in a top surface of the mold. In this embodiment, indentations 36 are shaped as hemispheres. Mold 30 also has a series of vapor channels 34. As will be made clear in step 18, vapor channels 34 allow for the vaporization of a lamination solvent. Mold 30 is made using surface micro-machining methods such as lithographic electroplate formation or microelectromechanical systems (MEMS).

Referring to FIG. 3, a polymer (e.g., polymethyl methacrylate (PMMA)) layer 40 is deposited on mold 30 (step 14) by holding the mold in a chuck and spraying with a solvent (e.g., acetone). The polymer, in a dry sheet form, is brought into contact of mold 30 by pressing the polymer onto the mold at room temperature. Polymer layer 40 fills-in indentations 36 and also extends into vapor channel 34. In other embodiments, the polymer is in roll lamination form. In still other embodiments, the polymer is applied to the mold in an evaporation chamber.

Figure 4:
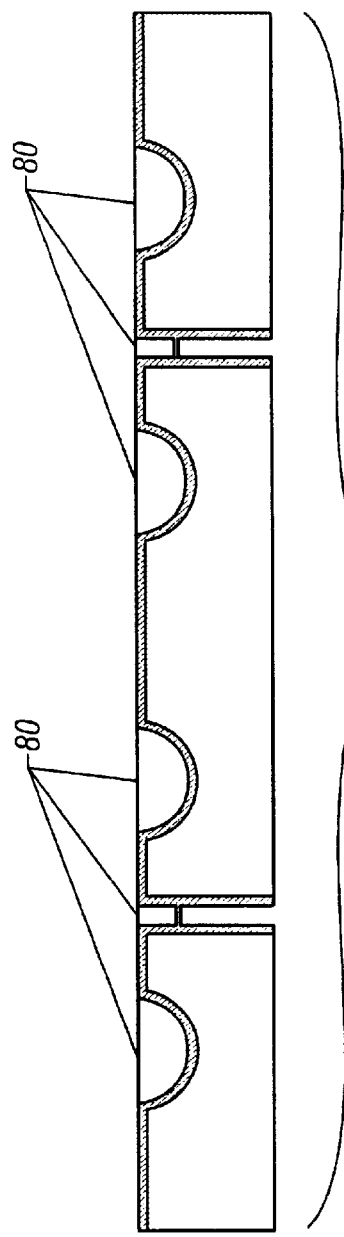
FIG. 4 is a cross-sectional diagram of the compliant material after etching to form a series of compliant structures.

Referring to FIG. 4, polymer layer 40 is removed so that anti-sticking coating 32 is exposed on the top surface of mold 30, but not within indentations 36 or vapor channels 34 (step 16), which remain filled with the polymer. A dry or wet chemical reaction or polishing is used to etch the polymer down to the anti-sticking coating 32 so that all of the polymer is removed except the polymer within vapor channels 34 and indentations 36. This creates a series of compliant structures 80.

Figure 5:
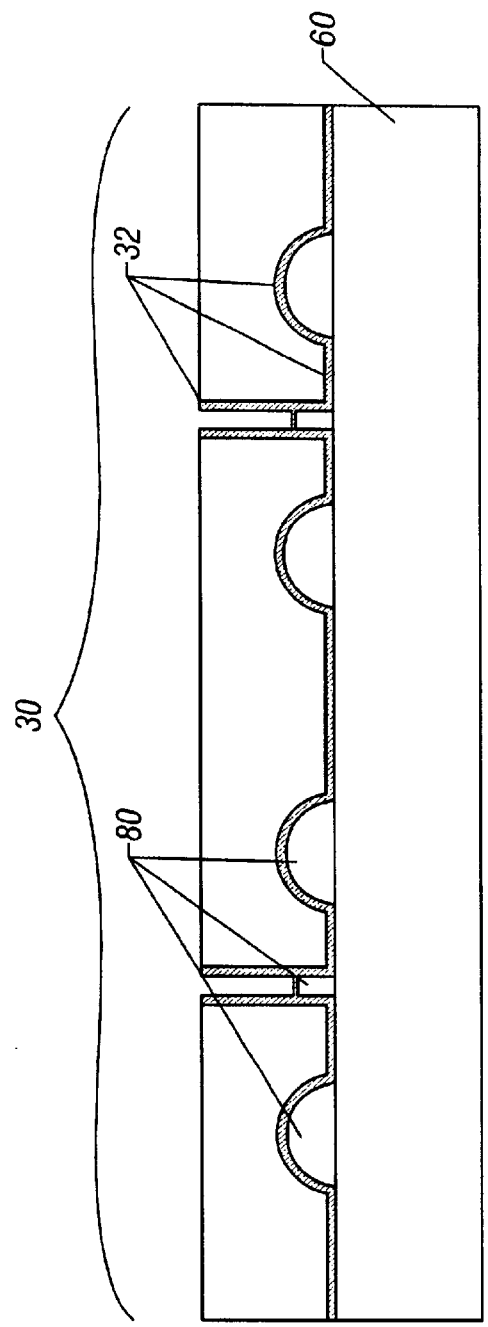
FIG. 5 is a cross-sectional diagram of the mold placed on top of a wafer.

Referring to FIG. 5, a laminating solvent (e.g., acetone) is sprayed on a top surface of wafer 60. Mold 30 is turned upside-down and placed on wafer 60 so that the anti-sticking coating 32 is in contact with wafer 30 (step 18). The chemical reaction of the polymer and the laminating solvent laminates compliant structures 80 with wafer 60. The laminating solvent is then vaporized and the resulting vapors escape through the polymer and through vapor channels 34. Once the bond is formed, the interface between wafer 60 and compliant structures 80 has a higher adhesiveness than the interface between anti-sticking solution 32 and wafer 60. In one practice of the invention, the adhesiveness between wafer 60 and compliant structures 80 is greater than 0.1 Newtons per square millimeter while the adhesiveness between anti-sticking coating 32 and wafer 60 is below 0.1 Newtons per square millimeter. The entire step 18 occurs at room temperature, thereby protecting the ICs from harsh temperature changes.

Figure 6:
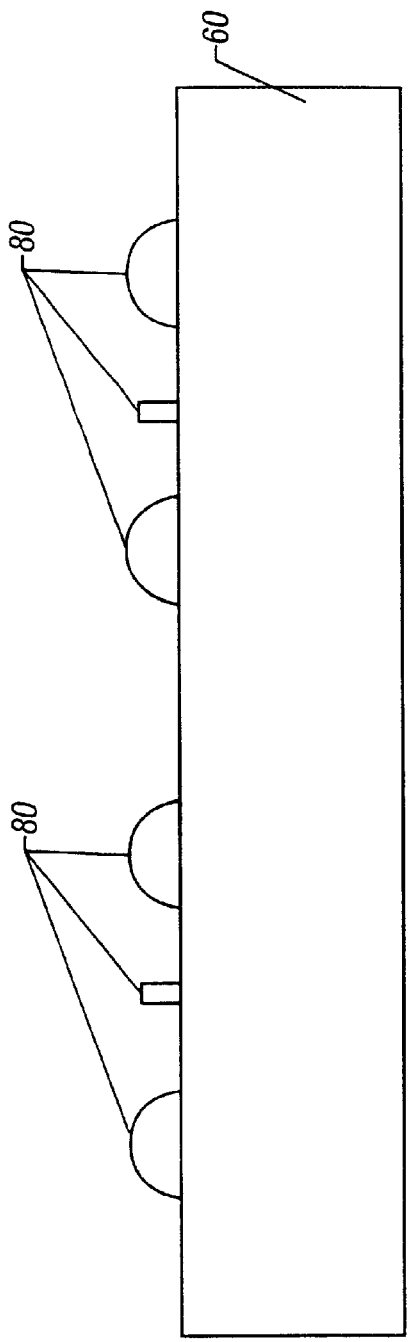
FIG. 6 is a cross-sectional diagram of the compliant structures on the wafer.
Figure 7:
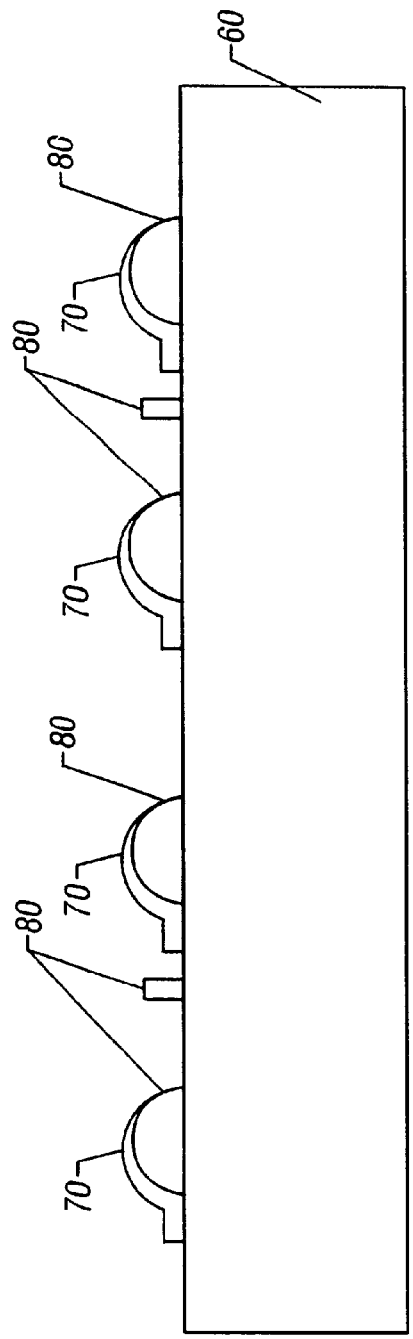
FIG. 7 is a cross-sectional diagram of the wafer with the compliant structures and a rerouting layer.

Referring to FIG. 6, the removal of mold 30 from wafer 60 occurs with ease because the compliant structures 80 adhere effectively to (step 20) the top surface of wafer 60. Referring to FIG. 7, a rerouting layer can be deposited on top of compliant structures 80 by placing a pattern over wafer 60 (step 22). The rerouting or interconnect layer is used to make electrical connections between the IC and a test apparatus for testing the electrical characteristics of the IC.

In other embodiments other indentations can be fabricated to allow more complex shapes to be formed (e.g., a winding staircase) depending on the specific application. For example, more complex shapes can be used to fabricate a snap mechanism to attach the wafer to a test board so that the wafer is mechanically secured to the test board during handling and testing.

In other embodiments, compliant structures can be fabricated in conjunction with compression stops. Compression stops protect the ICs from physical damage from the test handler, test socket, and burn-in board. Compression stops also reduce further compression by other structures. Thus, a compression stop can limit the amount of flex in a compliant structure.

Figure 8:
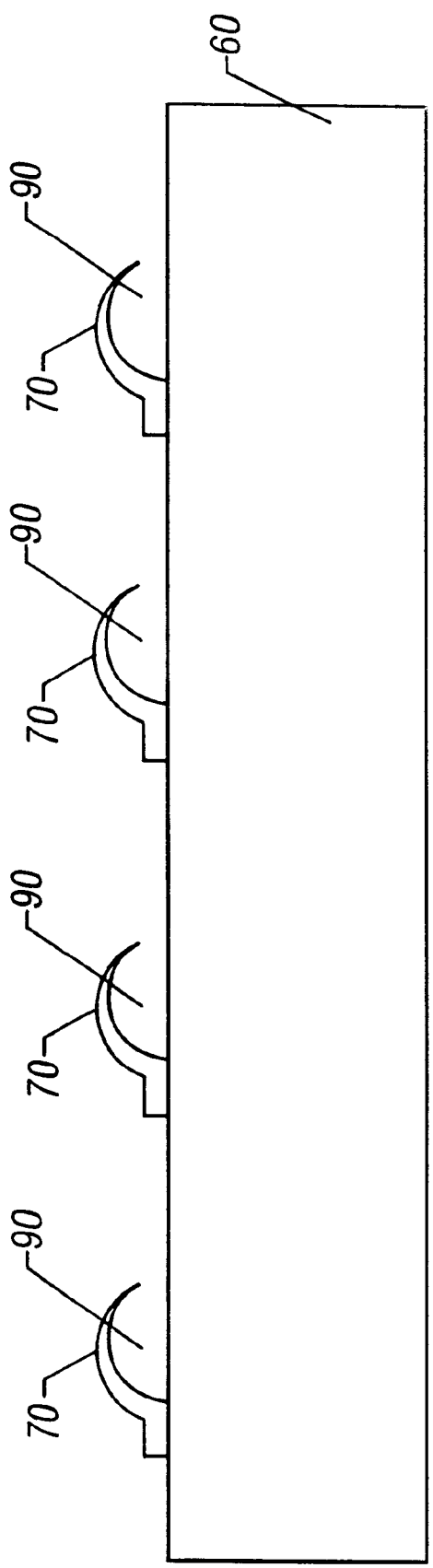
FIG. 8 is a cross-sectional view of the rerouting layer as the compliant structure.

The structures created on the wafer can be made of a compliant material or a non-compliant material. If a non-compliant material is used, a compliant material can be deposited in subsequent processing steps to fabricate the compliant structure. Alternatively, the non-compliant material could be added in the first deposition and rerouting 70 could be added in the second deposition. Referring to FIG. 8, the non-compliant element is then removed leaving a gap 90 underneath rerouting layer 70. In this configuration, the rerouting layer acts as a compliant element because of its ability to flex.

In other embodiments, the PMMA layer can be replaced with an epoxy, a polymer, or silicone. In still other embodiments, the mold is made from an epoxy or a resin. Other embodiments use computer-aided tools to fabricate the mold and to shape the indentations in the mold. Other embodiments perform the process in FIG. 1 at a temperature below a critical temperature that would cause damage to the ICs or warping of the wafers.

Other embodiments not described here are also within the scope of the following claims.

What is claimed is:

1. A method for fabricating a structure on an integrated circuit wafer, comprising:

applying an anti-sticking coating to a surface of a mold;

depositing a first material on the anti-sticking coating, thereby forming a first interface between the mold and the first material, the first interface having a first adhesiveness;

removing a portion of the first material to expose the anti-sticking coating;

placing the anti-sticking coating in contact with the wafer, thereby forming a second interface between the first material and the wafer, the second interface having a second adhesiveness greater than the first adhesiveness; and removing the mold from the wafer.

2. The method of claim 1, further comprising applying a second material to the wafer and to the first material.

3. The method of claim 2, further comprising forming a rerouting layer with the second material.

4. The method of claim 2, further comprising forming a rerouting layer with the first material.

5. The method of claim 4, further comprising removing the first material and forming a compliant structure from the second material.

6. The method of claim 1, further comprising laminating the first material onto the wafer.

7. The method of claim 6, wherein laminating comprises spraying a solvent onto the wafer to laminate the wafer onto the first material.

8. The method of claim 7, wherein laminating comprises laminating the first material to the wafer at room temperature.

9. The method of claim 6, further comprising incorporating a vapor channel into the mold.

10. The method of claim 6, further comprising using polymethyl methacrylate (PMMA) as the first material.

11. The method of claim 10, further comprising using acetone as the solvent.

12. The method of claim 1, further comprising using a compliant material as the first material to form a compliant structure.

13. The method of claim 12, further comprising forming a compression stop with the compliant structure.

14. The method of claim 1, further comprising forming a snap mechanism from the first material.

15. The method of claim 1, further comprising selecting the first material such that the first adhesiveness is less than 0.1 Newtons per square millimeter.

* * * * *